(12) United States Patent
Shiah et al.

(10) Patent No.: US 7,969,253 B2
(45) Date of Patent: Jun. 28, 2011

(54) VCO WITH STABILIZED REFERENCE CURRENT SOURCE MODULE

(75) Inventors: Chun Shiah, Hsinchu (TW); Cheng-Nan Chang, Tainan County (TW); Yu-Sheng Lai, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 176 days.

(21) Appl. No.: 12/505,540

(22) Filed: Jul. 20, 2009

(65) Prior Publication Data

US 2010/0073062 A1    Mar. 25, 2010

(30) Foreign Application Priority Data

Sep. 22, 2008   (TW) ................................ 97136297 A

(51) Int. Cl.
  *H03B 5/00*   (2006.01)
(52) U.S. Cl. ............ 331/185; 331/57; 331/34; 331/175; 327/156
(58) Field of Classification Search .................. 539/175, 539/176, 185; 327/539, 156; 331/175, 176, 331/185, 57, 34
See application file for complete search history.

(56) References Cited

U.S. PATENT DOCUMENTS

| 7,116,181 B2 * | 10/2006 | Bakker | ......................... 331/111 |
| 7,737,768 B2 * | 6/2010 | Byeon | ........................... 327/539 |
| 2007/0075699 A1 | 4/2007 | Chih | |

FOREIGN PATENT DOCUMENTS

| CN | 101313467 A | 11/2008 |
| JP | 200694334 A | 4/2006 |

* cited by examiner

*Primary Examiner* — Arnold Kinkead
(74) *Attorney, Agent, or Firm* — Winston Hsu; Scott Margo

(57) ABSTRACT

A VCO includes a reference current module and a clock signal generating module. The reference current module generates a reference current according to a reference voltage. The clock signal generating module generates a clock signal according to the reference current. The reference current module utilizes the negative feed-back mechanism to keep the generated reference current at the predetermined size without being changed with the variation of the process and the bias source.

21 Claims, 4 Drawing Sheets

VCO WITH STABILIZED REFERENCE CURRENT SOURCE MODULE

BACKGROUND OF THE INVENTION

1. Field of the Invention

The present invention relates to a Voltage Controlled Oscillator (VCO), and more particularly, to a VCO that is not affected by the variations of the process and the bias voltage source.

2. Description of the Prior Art

Please refer to FIG. 1. FIG. 1 is a diagram illustrating a conventional VCO 100. The VCO 100 comprises a reference current source module 110 and a clock signal generating module 120. The reference current source module 110 functions to generate reference currents $I_{BIAS}$ and $I_1$, as well as the voltages $V_A$ and $V_B$. The clock signal generating module 120 generates a clock signal CLK with a frequency corresponding to the level of the voltages $V_A$ and $V_B$.

The reference current source module 110 comprises P-type Metal Oxide Semiconductor (PMOS) transistors $Q_{P1}$ and $Q_{P2}$, and N-type Metal Oxide Semiconductor (NMOS) transistors $Q_{N1}$ and $Q_{N2}$. The source (first end) of transistor $Q_{P1}$ is coupled to the bias voltage source $V_{DD}$; the gate (control end) of the transistor $Q_{P1}$ is coupled to the gate of the transistor $Q_{P2}$; the drain (second end) of the transistor $Q_{P1}$ is coupled to the drain of the transistor $Q_{N1}$. The source (first end) of the transistor $Q_{P2}$ is coupled to the bias voltage source $V_{DD}$; the gate (control end) of transistor $Q_{P2}$ is coupled to the gate of the transistor $Q_{P1}$; the drain (second end) of the transistor $Q_{P2}$ is coupled to the drain of the transistor $Q_{N2}$. The source (first end) of the transistor $Q_{N1}$ is coupled to the bias voltage source $V_{SS}$ (ground end); the gate (control end) of the transistor $Q_{N1}$ is utilized to receive the reference voltage $V_{REF}$; the drain (second end) of transistor $Q_{N1}$ is coupled to the drain of the transistor $Q_{P1}$. The source (first end) of the transistor $Q_{N2}$ is coupled to the bias voltage source $V_{SS}$; the gate (control end) of transistor $Q_{N2}$ is coupled to the drain of transistor $Q_{P2}$; the drain (second end) of transistor $Q_{N2}$ is coupled to the drain of transistor $Q_{P2}$.

The transistor $Q_{N1}$ receives the reference voltage $V_{REF}$ and drains the current $I_{BIAS}$, with the magnitude corresponding to the voltage level of the reference voltage $V_{REF}$, from the transistor $Q_{P1}$. The transistors $Q_{P2}$ and $Q_{N2}$ form a current mirror for generating the current $I_1$ and the corresponding control voltages $V_A$ and $V_B$, where the current $I_1$ is a replica of the current $I_{BIAS}$. Hence, the voltages $V_A$ and $V_B$ can then drive the current source of the clock signal generator 120 to generate a current with the same magnitude as the current $I_{BIAS}$, and further generate the clock signal CLK with the frequency corresponding to the current generated by the current source of the clock signal generator 120.

However, the threshold voltage level of the Metal Oxide Semiconductor (MOS) transistor is influenced by the process variation. According to the current generating formula of the NMOS transistor:

$$I = K(V_{GS} - V_{TH})^2 \quad (1);$$

where K represents a constant, $V_{GS}$ represents the voltage difference between the gate and the source of the NMOS transistor, and $V_{TH}$ represents the threshold voltage of the NMOS transistor, the current $I_{BIAS}$ being drained by the transistor $Q_{N1}$ of the reference current source module 110 can be calculated from the above formula as below:

$$I_{BIAS} = K(V_{REF} - V_{SS} - V_{TH})^2 \quad (2).$$

From formula (2), it can be seen that even in the presence of constant reference voltage $V_{REF}$, the reference current $I_{BIAS}$ is still dependent on the threshold voltage $V_{TH}$ and the bias voltage source $V_{SS}$, consequently affecting the magnitude of the replicated current $I_1$ and the subsequently generated voltages $V_A$ and $V_B$. Therefore, since the current generated by the clock signal generating module 120 is controlled by the voltages $V_A$ and $V_B$, the frequency of the output clock signal CLK is inevitably affected, causing great inconvenience.

SUMMARY OF THE INVENTION

The present invention provides a Voltage Controlled Oscillator (VCO) that is not affected by the process or the bias voltage source. The VCO generates a clock signal with a frequency corresponding to a reference voltage. The VCO comprises a reference current source generating module and a clock signal generating module. The reference current source generating module comprises an amplifier, a resistor and a first transistor. The amplifier comprises a positive input end for receiving the reference voltage, an negative end, and an output end coupled to the negative end of the amplifier. The resistor is coupled between the negative end of the amplifier and a ground end. The first transistor comprises a first end coupled to a bias voltage source, a control end coupled to the output end of the amplifier, and a second end. The first transistor generates a reference current according to the reference voltage. The clock signal generating module outputs the clock signal with the corresponding frequency according to the reference current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
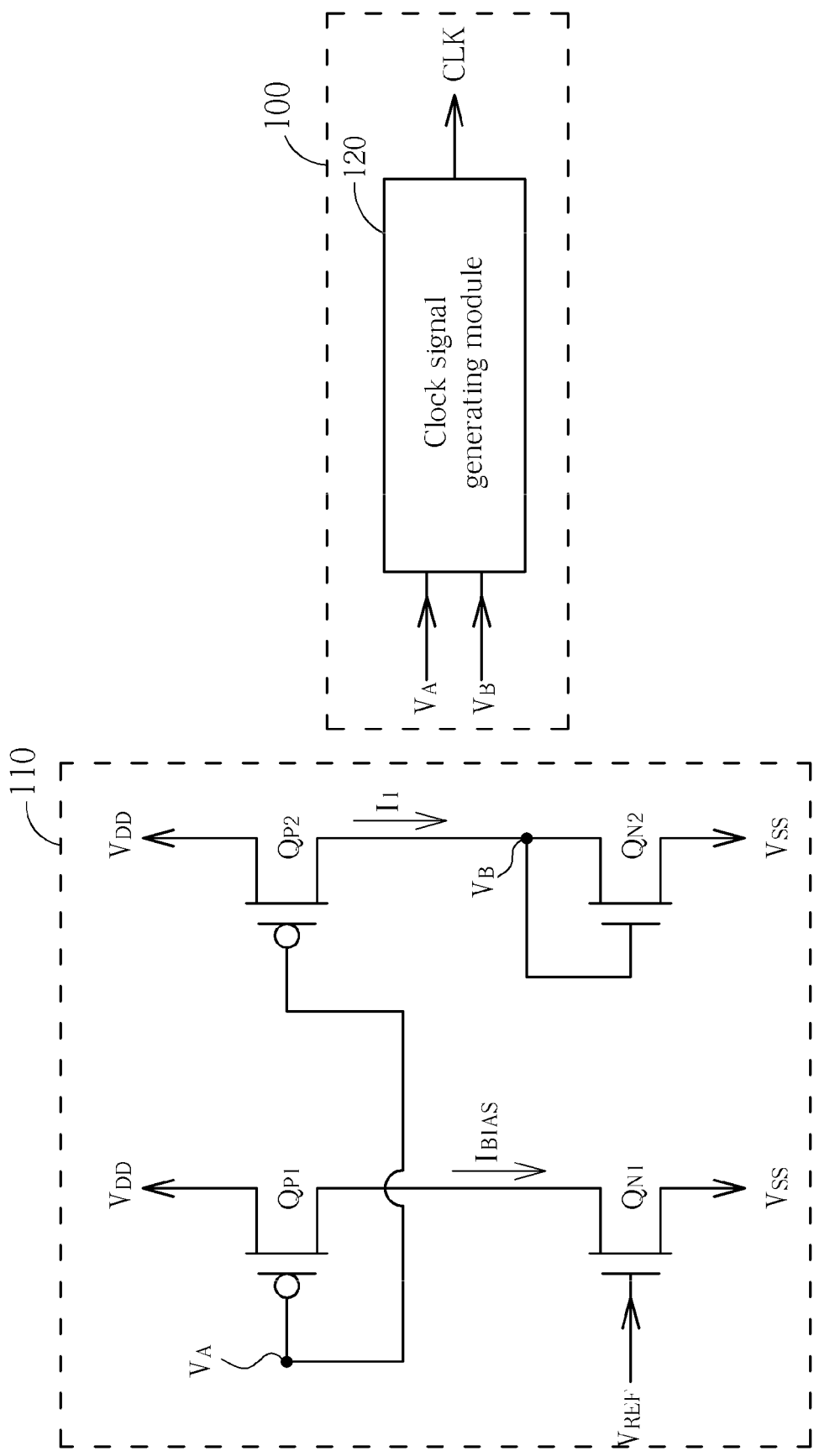
FIG. 1 is a diagram illustrating a conventional VCO.
Figure 2:
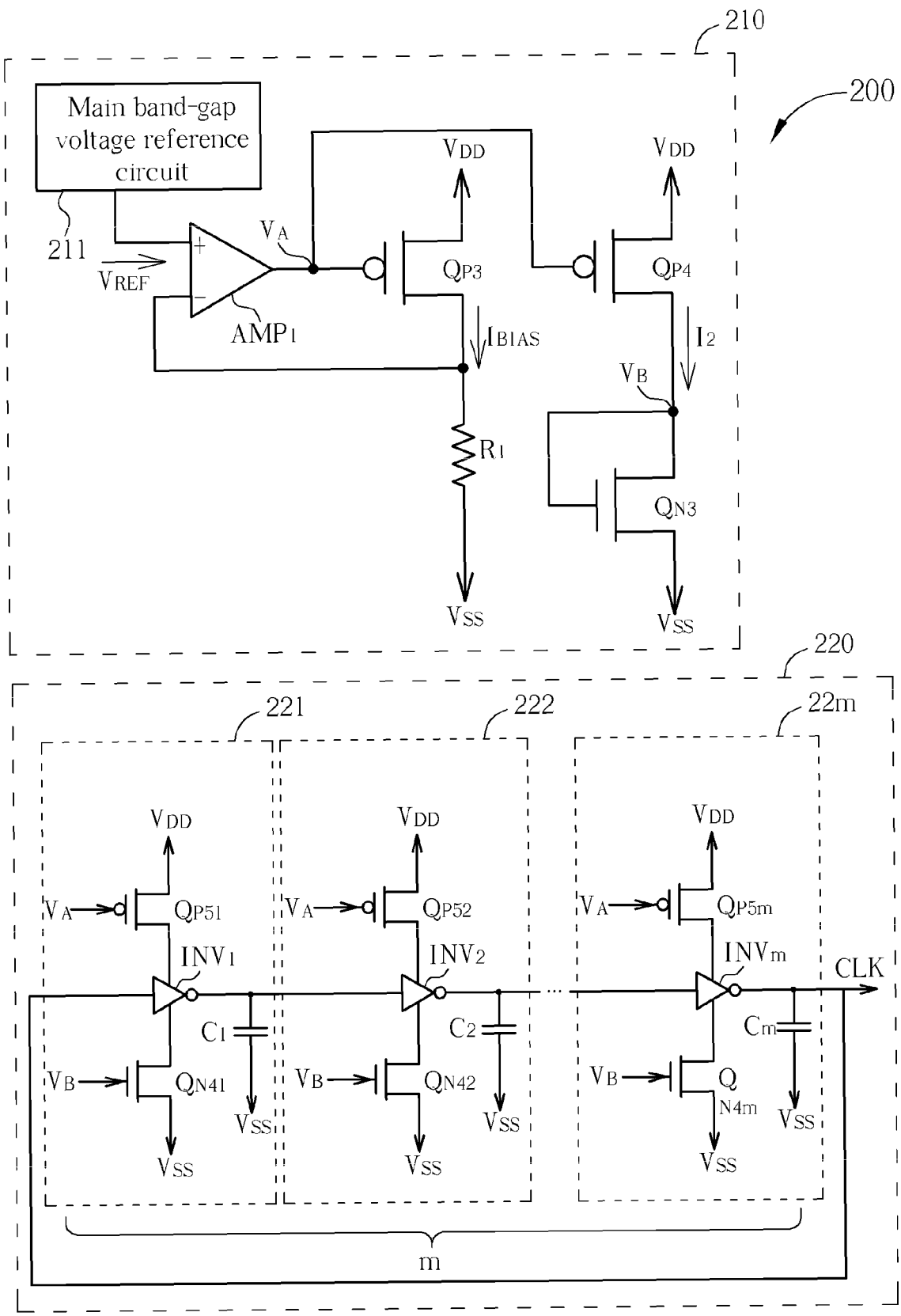
FIG. 2 is a diagram illustrating a VCO of the present invention.

Please refer to FIG. 2. FIG. 2 is a diagram illustrating a VCO 200 of the present invention. The VCO 200 comprises a reference current source module 210 and a clock signal generating module 220. The reference current source module 210 functions to generate reference currents $I_{BIAS}$ and $I_2$, as well as voltages $V_A$ and $V_B$. The clock signal generating module 220 generates a clock signal CLK with a frequency corresponding to the levels of the voltages $V_A$ and $V_B$.

The reference current source module 210 comprises two PMOS transistors $Q_{P3}$ and $Q_{P4}$, an NMOS transistor $Q_{N3}$, a resistor $R_1$, a main band-gap voltage reference circuit 211, and an amplifier $AMP_1$. The source (first end) of the transistor $Q_{P3}$ is coupled to the bias voltage source $V_{DD}$; the gate (control end) of the transistor $Q_{P3}$ is coupled to the output end of the amplifier $AMP_1$; the drain (second end) of the transistor $Q_{P3}$ is coupled to the negative input end of the amplifier $AMP_1$ and the resistor $R_1$. The resistor $R_1$ is coupled between the negative input end of the amplifier $AMP_1$ and the bias voltage source $V_{SS}$. The positive input end of the amplifier $AMP_1$ is coupled to the main band-gap voltage reference circuit 211 for receiving the reference voltage $V_{REF}$; the negative input end of the amplifier $AMP_1$ is coupled between the resistor $R_1$ and the source of the transistor $Q_{P3}$; the output end of the amplifier $AMP_1$ is coupled to the gate of the transistor $Q_{P3}$. The source (first end) of the transistor $Q_{P4}$ is coupled to the bias voltage source $V_{DD}$; the gate (control end) of the transistor $Q_{P4}$ is coupled to the gate of the transistor $Q_{P3}$; the drain (second end) of the transistor $Q_{P4}$ is coupled to the drain of the transistor $Q_{N3}$. The source (first end) of the transistor $Q_{N3}$ is coupled to the bias voltage source $V_{SS}$; the gate (control end) of the transistor $Q_{N3}$ is coupled to the drain of the transistor $Q_{P4}$; the drain (second end) of the transistor $Q_{N3}$ is coupled to the drain of the transistor $Q_{P4}$.

The positive input end of the amplifier $AMP_1$ is coupled to the main band-gap voltage reference circuit 211 for receiving the reference voltage $V_{REF}$. Hence, the negative input end of the amplifier $AMP_1$ is accordingly clamped to the level of the voltage $V_{REF}$. As shown in FIG. 2, the current (which is equivalent to the reference current $I_{BIAS}$) flowing through the resistor $R_1$ is $(V_{REF}/R_1)$. Therefore, since the reference current $I_{BIAS}$ is clamped to $(V_{REF}/R_1)$, varying the bias voltage source and/or the threshold voltage no longer affects the reference current $I_{BIAS}$. The current $I_2$, which is replicated from the current mirror formed by the transistors $Q_{P4}$ and $Q_{N3}$, inherent the characteristics of the reference current $I_{BIAS}$ and avoids being affected by the bias voltage and/or the threshold voltage. As a result, the current source generated by the clock signal generating module 220, which is controlled by the voltages $V_A$ and $V_B$, is impervious to the bias voltage source and the threshold voltage. Hence, the clock signal CLK outputted from the clock signal generating module 220 can be generated with the accurate frequency corresponding to the voltage level of the reference voltage $V_{REF}$.

Please continue referring to FIG. 2. The clock signal generating module 220 comprises m inverting modules 221~22m. The number of inverting modules (which is equivalent to m) in the clock signal generating module 220 must be odd, for being able to generate the clock signal (the clock signal cannot be generated with an even number of inverting modules). Each inverting module comprises an inverter, an NMOS transistor, a PMOS transistor, and a capacitor. The inverter of every inverting module is utilized to receive the signal generated from the inverting module of the previous stage, and the received signal is then inverted for outputting to the inverting module of the next stage. The outputted signal of the $m^{th}$ inverting module is utilized as the final outputted clock signal CLK, and meanwhile the outputted signal of the $m^{th}$ inverting module is fed back to the inverter of the $1^{st}$ inverting module. For instance, the $1^{st}$ inverting module 221 comprises an inverter $INV_1$, a transistor $Q_{N41}$, a transistor $Q_{P51}$, and a capacitor $C_1$. The transistors $Q_{N41}$ and $Q_{P51}$ form a current mirror for replicating the current $I_2$, which is replicated from the current mirror formed by the transistor $Q_{P4}$ and $Q_{N3}$. The source of the transistor $Q_{P51}$ is coupled to the bias voltage source $V_{DD}$; the gate of the transistor $Q_{P51}$ functions to receive the voltage $V_A$; the drain of the transistor $Q_{P51}$ is utilized to output the current $I_2$. The source of the transistor $Q_{P41}$ is coupled to the bias voltage source $V_{SS}$; the gate of the transistor $Q_{P41}$ functions to receive the voltage $V_B$; the drain of the transistor $Q_{P41}$ is utilized to drain the current $I_2$.

The inverter $INV_1$ comprises two current ends, an input end, and an output end. The two current ends of the inverter $INV_1$ are coupled to the drain of the transistor $Q_{P51}$ and the drain of the transistor $Q_{N41}$ respectively, for receiving/draining current accordingly. In other words, the current flowing through the inverter $INV_1$ is equivalent to the current $I_2$. The input end of the inverter $INV_1$ is coupled to the output end of the inverter $INV_m$ of the inverting module 22m, for receiving the clock signal CLK; the output end of the inverter $INV_1$ is coupled to the capacitor $C_1$ and the input end of the inverter $INV_2$ of the inverting module 222 of the next stage. The capacitor $C_1$ is coupled between the output end of the inverter 221 and the bias voltage source $V_{SS}$. Hence, the inverter 221 can adjust the duration of the inverted signal being outputted (due to the presence of capacitor $C_1$, the time required for capacitor $C_1$ to charge/discharge depends on the magnitude of current $I_2$), according to the magnitude of the received current $I_2$. For instance, when the inverter $INV_1$ receives an input signal with the low voltage level, if the current $I_2$ is at a relative higher level, the response time required for the inverter $INV_1$ to output an output signal with the high voltage level (inverted from the input signal with the low voltage level) is relatively shorter; and vice versa. The structure and operation principle of the inverter modules of other levels can be extrapolated from the discussion above and is omitted hereafter for brevity.

The VCO of the present invention comprises a reference current source module which is unaffected by the variations of the process and the bias voltage source. Hence, the VCO of the present invention can generate a clock signal with a stable frequency. The frequency of the generated clock signal is adjusted according to the input reference voltage $V_{REF}$ without being affected by the variations of the process and the bias voltage source.

Furthermore, in the reference current source module 210 of the present invention, the reference voltage $V_{REF}$ outputted from the main band-gap voltage reference circuit 211 can be designed to be temperature-related. For instance, when the temperature rises, the voltage level of the reference voltage $V_{REF}$ also rises accordingly, and vice versa; when the temperature declines, the level of reference voltage $V_{REF}$ decreases accordingly. The above relation can be formulated as below:

$$V_{REF}=V_{REF\_INI}\times(1+JT) \quad (3); \text{ or}$$

$$V_{REF}=V_{REF\_INI}\times(1-JT) \quad (4);$$

where $V_{REF}$ represents the reference voltage $V_{REF}$, which is adjusted according to the temperature, outputted from the main band-gap voltage reference circuit 211; $V_{REF\_INI}$ represents the default reference voltage outputted from the main band-gap voltage reference circuit 211; T represents the level of temperature variation; J represents a temperature variable (positive value). Hence, through such design formulated in formula (3), when the temperature rises, the reference voltage $V_{REF}$ also increases, resulting in an increase of the currents $I_{BIAS}$ ($I_{BIAS}=V_{REF}/R_1$) and $I_2$. Because of the current increase, the response speed of the inverting modules of the clock signal generating module 220 is accelerated, consequently affecting the frequency of the clock signal CLK to increase accordingly. In contrast, when the temperature declines, the reference voltage $V_{REF}$ decreases, resulting in a decline of the currents $I_{BIAS}$ ($I_{BIAS}=V_{REF}/R_1$) and $I_2$. Because of the current drop, the response speed of the inverting modules of the clock signal generating module 220 is decelerated, consequently affecting the frequency of the clock signal CLK to decrease accordingly.

Figure 3:
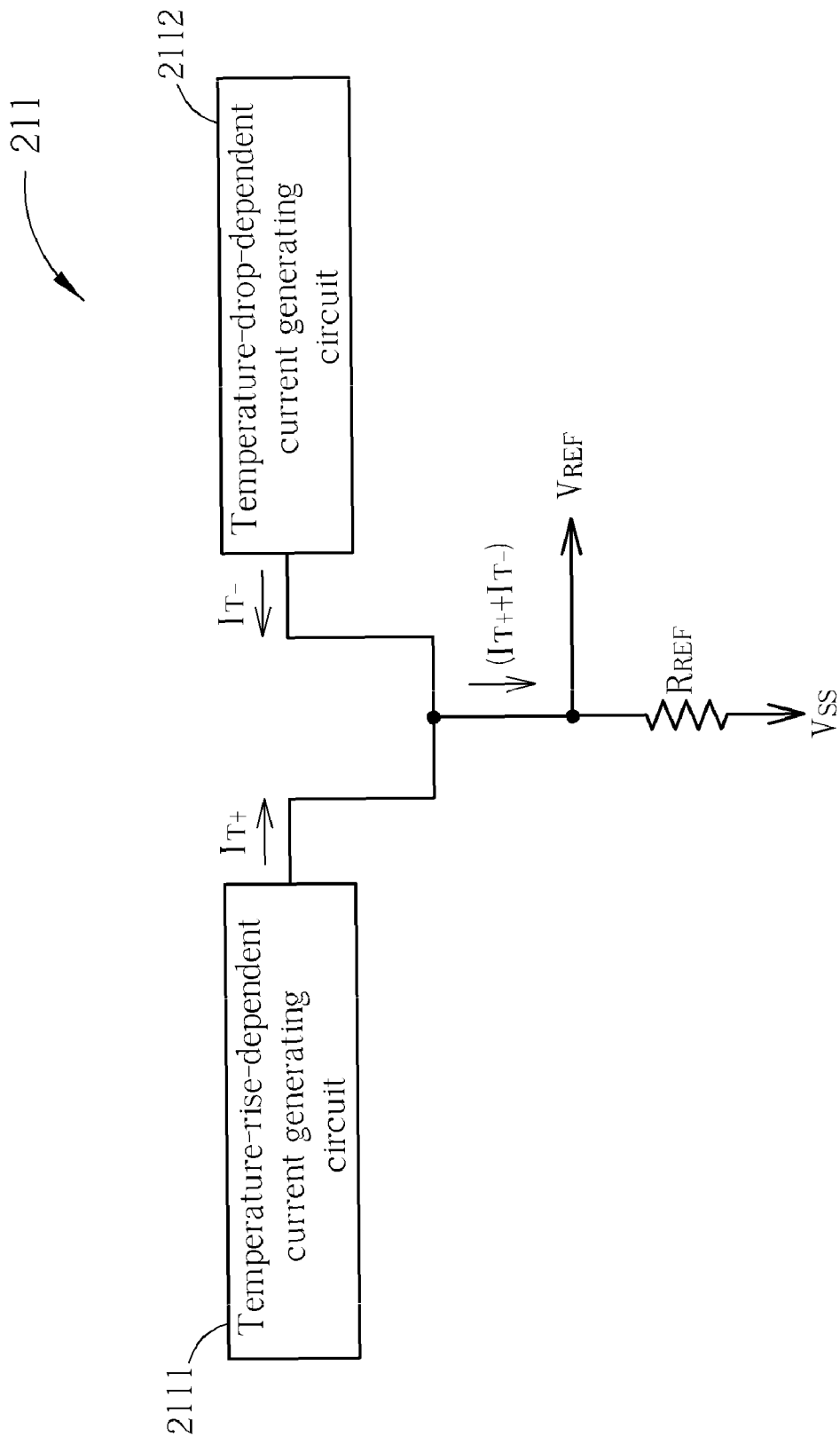
FIG. 3 is a diagram illustrating the main band-gap voltage reference circuit of the present invention.

Please refer to FIG. 3. FIG. 3 is a diagram illustrating the main band-gap voltage reference circuit 211 of the present invention. As shown in FIG. 3, the main band-gap voltage reference circuit 211 comprises a temperature-rise-dependent current generating circuit 2111, a temperature-drop-dependent current generating circuit 2112 and a resistor $R_{REF}$. The temperature-rise-dependent current circuit 2111 functions to generate a temperature-rise-dependent current $I_{T+}$, which increases as the temperature rises. The temperature-drop-dependent current circuit 2112 functions to generate a temperature-drop-dependent current $I_{T-}$, which increases as the temperature decreases. The resistor $R_{REF}$ is coupled between the bias voltage source $V_{SS}$ and the output ends of the temperature-rise-dependent current generating circuit 2111 and the temperature-drop-dependent current generating circuit 2112 for receiving the temperature-rise-dependent current $I_{T+}$ and the temperature-drop-dependent current $I_{T-}$. The voltage across the resistor $R_{REF}$ is equivalent to the reference voltage $V_{REF}$ [where $V_{REF}=R_{REF}\times(I_{T+}+I_{T-})$] outputted by the main band-gap voltage reference circuit 211.

Figure 4:
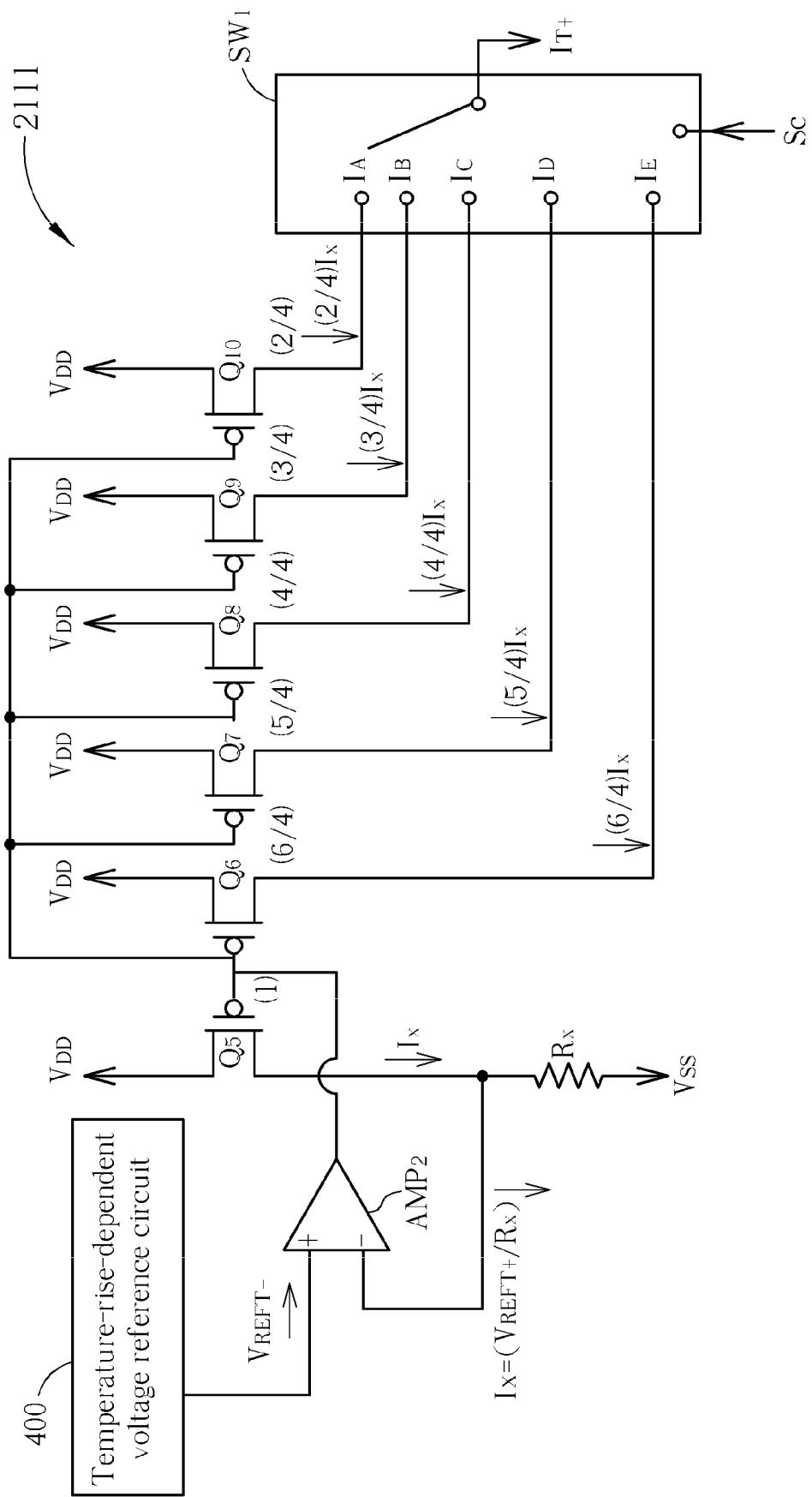
FIG. 4 is a diagram illustrating the temperature-rise-dependent current generating circuit of the present invention.

Please refer to FIG. 4. FIG. 4 is a diagram illustrating the temperature-rise-dependent current generating circuit 2111 of the present invention. As shown in FIG. 4, the temperature-rise-dependent current generating circuit 2111 comprises a temperature-rise-dependent band-gap voltage reference circuit 400, an amplifier $AMP_2$, a resister $R_X$, six transistors $Q_5 \sim Q_{10}$, and a switch $SW_1$. The transistors $Q_5 \sim Q_{10}$ are PMOS transistors. The aspect ratios (width/length) of the transistors $Q_5 \sim Q_{10}$ are 1:6/4:5/4:4/4:3/4:2/4, respectively. Hence, with identical gate voltage supplies, the ratio of the current generated by the transistors $Q_5 \sim Q_{10}$ are also 1:6/4:5/4:4/4:3/4:2/4, respectively.

The temperature-rise-dependent band-gap voltage reference circuit 400 functions to generate a temperature-rise-dependent reference voltage $V_{REFT+}$. The voltage level of the temperature-rise-dependent reference voltage $V_{REFT+}$ increases with the temperature. The positive input end of the amplifier $AMP_2$ is coupled to the temperature-rise-dependent band-gap voltage reference circuit 400, for receiving the reference voltage $V_{REFT+}$. Hence, the negative input end of the amplifier $AMP_2$ is inherently clamped to the voltage $V_{REFT+}$. The sources of the transistors $Q_5 \sim Q_{10}$ are coupled to the bias voltage source $V_{DD}$; the gates of the transistors $Q_5 \sim Q_{10}$ are coupled to the output end of the amplifier $AMP_2$; the drain of the transistor $Q_5$ is coupled to the negative input end of the amplifier $AMP_2$. As shown in FIG. 4, the current $I_X$ flowing pass the resistor $R_x$ is equivalent to ($V_{REFT+}/R_X$). Hence, the gate of the transistor $Q_5$ is controlled by the amplifier $AMP_2$, for ensuring the magnitude of the current $I_X$ outputted is kept at ($V_{REFT+}/R_X$). Similarly, as controlled by the amplifier $AMP_2$, the magnitudes of the currents outputted by the transistors $Q_6 \sim Q_{10}$ are $(6/4)I_X$, $(5/4)I_X$, $(4/4)I_X$, $(3/4)I_X$, $(2/4)I_X$, respectively. The switch $SW_1$ comprises input ends $I_A$, $I_B$, $I_C$, $I_D$, and $I_E$, an output end O, and a control end C. Each of input ends $I_A \sim I_E$ of the switch $SW_1$ is coupled to the drain of the transistors $Q_6 \sim Q_{10}$, for receiving the currents $(6/4)I_X$, $(5/4)I_X$, $(4/4)I_X$, $(3/4)I_X$, $(2/4)I_X$, respectively. A control signal $S_C$ received by the control end C of the switch $SW_1$, the switch $SW_1$ switches one of input ends $I_A \sim I_E$ of the switch $SW_1$ to couple to the output end O of the switch $SW_1$, for directing the received current to output as the temperature-rise-dependent current $I_{T+}$ of the temperature-rise-dependent current generating circuit 2111. For instance, when the switch $SW_1$ switches the input end $I_E$ of the switch $SW_1$ to couple to the output end O of the switch $SW_1$, the temperature-rise-dependent current $I_{T+}$ outputted is $(2/4)I_X$, which is equivalent to $(2/4)\times(V_{REFT+}/R_X)$. The switch $SW_1$ can be realized with a set of fuses. For instance, the switch $SW_1$ can comprise five fuses, where one end of each fuse is coupled to the drain of the corresponding transistors $Q_6 \sim Q_{10}$ respectively and the other end of each fuse is coupled to the output end O of the switch $SW_1$. The user can burn down fuses selectively to determine the magnitude of the outputted temperature-rise-dependent current $I_{T+}$ of the temperature-rise-dependent current generating circuit 2111. For instance, the user can burn down all fuses but the one coupled between the transistor $Q_{10}$ and the output end O of switch $SW_1$, resulting in the temperature-rise-dependent current $I_{T+}$ to be $(2/4)I_X$.

The structure and operation principle of the temperature-drop-dependent current generating circuit 2112 is similar to the temperature-rise-dependent current generating circuit 2111, and the relative description is omitted hereafter for brevity. The only difference being that in the temperature-drop-dependent current generating circuit 2112 is: the band-gap voltage reference circuit being utilized is a temperature-drop-dependent band-gap voltage reference circuit (as opposed to the temperature-rise-dependent band-gap voltage reference circuit used in the temperature-rise-dependent current generating circuit 2111), where the voltage level of the generated reference voltage decreases as the temperature increases.

To sum up, the present invention provides a VCO that is not only unaffected by the variations of the process and the bias voltage source, but is also able to adjust the frequency of the output clock signal according to the temperature variation, hence providing great convenience.

Those skilled in the art will readily observe that numerous modifications and alterations of the device and method may be made while retaining the teachings of the invention.

What is claimed is:

1. A Voltage Controlled Oscillator (VCO) without being affected by process or bias voltage source, the VCO generating a clock signal with a frequency corresponding to a reference voltage, the VCO comprising:
    a reference current source generating module, comprising:
        an amplifier, comprising:
            a positive input end, for receiving the reference voltage;
            an negative end; and
            an output end, coupled to the negative end of the amplifier;
        a resistor, coupled between the negative end of the amplifier and a ground end;
        a first transistor, comprising:
            a first end, coupled to a bias voltage source;
            a control end, coupled to the output end of the amplifier; and
            a second end, the first transistor generating a reference current according to the reference voltage;
        a second transistor, comprising:
            a first end, coupled to the bias voltage source;
            a control end, coupled to the output end of the amplifier, for providing a first bias voltage; and
            a second end; and
        a third transistor, comprising:
            a first end, coupled to the ground end;
            a control end, coupled to the second end of the second transistor, for providing a second bias voltage; and
            a second end, coupled to the second end of the second transistor;
            wherein the first bias voltage and the second bias voltage are to provide for the clock signal generating module to generate the clock signal with the corresponding frequency according to the reference current;
    a clock signal generating module, for outputting the clock signal with the corresponding frequency according to the reference current; and a main band-gap voltage reference circuit coupled to the positive input end of the amplifier, for providing the reference voltage, the main band-gap voltage reference circuit comprising:
  a temperature-rise-dependent current generating circuit, for generating a temperature-rise-dependent current which increases as the temperature rises, wherein the temperature-rise-dependent current generating circuit comprises:
    a temperature-rise-dependent band-gap voltage reference circuit, for generating a temperature-rise-dependent reference voltage which increases as the temperature rises;
    an amplifier, comprising:
      a positive input end coupled to the temperature-rise-dependent band-gap voltage reference circuit, for receiving the temperature-rise-dependent reference voltage;
      a negative end; and
      an output end;
    a first transistor, comprising:
      a first end, coupled to the bias voltage source;
      a second end, coupled to the negative input end of the amplifier; and
      a control end, coupled to the output end of the amplifier;
    a resistor, coupled between the ground end and the negative input end of the amplifier;
    a plurality of second transistors, each second transistor comprising:
      a first end, coupled to the bias voltage source;
      a second end; and
      a control end, coupled to the output end of the amplifier; and
    a switch, comprising:
      a plurality of input ends, each input end coupled respectively to the second end of a corresponding second transistor of the plurality of second transistors;
      an output end, for outputting the temperature-rise-dependent current; and
      a control end, for receiving a control signal for coupling one of the plurality of input ends of the switch to the output end of the switch; and
  a resistor coupled to an output end of the temperature-rise-dependent current generating circuit, for receiving the temperature-rise-dependent current;
  wherein the reference voltage outputted by the main band-gap voltage reference circuit is generated according to the resistor and the temperature-rise-dependent current.

2. The VCO of claim 1, wherein the first transistor of the reference current source generating module is a P-type Metal Oxide Semiconductor (PMOS) transistor.

3. The VCO of claim 1, wherein the second transistor of the reference current source generating module is a PMOS transistor and the third transistor of the reference current source generating module is an N-type Metal Oxide Semiconductor (NMOS) transistor.

4. The VCO of claim 1, wherein the clock signal generating module comprises N inverting modules.

5. The VCO of claim 4, wherein a first inverting module of the N inverting modules comprises:
  a fourth transistor, comprising:
    a first end, coupled to the bias voltage source;
    a control end coupled to the control end of the second transistor, for receiving the first bias voltage; and
    a second end, for outputting the reference current according to the first bias voltage;
  a fifth transistor, comprising:
    a first end, coupled to the ground end;
    a control end coupled to the control end of the third transistor, for receiving the second bias voltage; and
    a second end, for draining the reference current according to the second bias voltage;
  an inverter, comprising:
    a first current end coupled to the second end of the fourth transistor, for receiving the reference current;
    a second current end coupled to the second end of the fifth transistor, for outputting the reference current;
    an input end, for receiving an input signal; and
    an output end coupled to an input end of an inverter of a second inverting module, for outputting an output signal;
    wherein the inverter of the first inverting module inverts the input signal to the output signal; and
  a capacitor, coupled to the output end of the inverter of the first inverting module.

6. The VCO of claim 5, wherein the fourth transistor is a PMOS transistor and the fifth transistor is an NMOS transistor.

7. The VCO of claim 4, wherein a $k^{th}$ inverting module of the N inverting modules comprises:
  a fourth transistor, comprising
    a first end, coupled to the bias voltage source;
    a control end coupled to the control end of the second transistor, for receiving the first bias voltage; and
    a second end, for outputting the reference current according to the first bias voltage;
  a fifth transistor, comprising:
    a first end, coupled to the ground end;
    a control end coupled to the control end of the third transistor, for receiving the second bias voltage; and
    a second end, for draining the reference current according to the second bias voltage;
  an inverter, comprising:
    a first current end coupled to the second end of the fourth transistor, for receiving the reference current;
    a second current end coupled to the second end of the fifth transistor, for outputting the reference current;
    an input end, coupled to an output end of an inverter of a $(K-1)^{th}$ inverting module for receiving an input signal from the $(K-1)^{th}$ inverting module; and
    an output end coupled to an input end of an inverter of an $(K+1)^{th}$ inverting module, for outputting an output signal;
    wherein the inverter of the $K^{th}$ inverting module inverts the input signal from the $(K-1)^{th}$ inverting module to the output signal; and
  a capacitor, coupled to the output end of the inverter of the $K^{th}$ inverting module;
  wherein 1<K<N, and K is a positive natural number.

8. The VCO of claim 7, wherein the fourth transistor is a PMOS transistor and the fifth transistor is an NMOS transistor.

9. The VCO of claim 4, wherein a $N^{th}$ inverting module of the N inverting module comprises:
  a fourth transistor, comprising:
    a first end, coupled to the bias voltage source;
    a control end coupled to the control end of the second transistor, for receiving the first bias voltage; and
    a second end, for outputting the reference current according to the first bias voltage;

a fifth transistor, comprising:
    a first end, coupled to the ground end;
    a control end coupled to the control end of the third transistor, for receiving the second bias voltage; and
    a second end, for draining the reference current according to the second bias voltage;
an inverter, comprising:
    a first current end coupled to the second end of the fourth transistor, for receiving the reference current;
    a second current end coupled to the second end of the fifth transistor, for outputting the reference current;
    an input end, coupled to an output end of an inverter of a $(N-1)^{th}$ inverting module for receiving an input signal; and
    an output end coupled to an input end of an inverter of a first inverting module, for outputting an output signal;
    wherein the inverter of the $N^{th}$ inverting module inverts the input signal from the $(N-1)^{th}$ inverting module to the output signal;
    wherein the output signal is outputted as the clock signal with the frequency corresponding to the reference current;
    wherein the output signal is transmitted to the inverter of the first inverting module; and
a capacitor, coupled to the output end of the inverter of the $N^{th}$ inverting module.

10. The VCO of claim 9, wherein the fourth transistor is a PMOS transistor and the fifth transistor is an NMOS transistor.

11. A Voltage Controlled Oscillator (VCO) without being affected by process or bias voltage source, the VCO generating a clock signal with a frequency corresponding to a reference voltage, the VCO comprising: a reference current source generating module, comprising:
    an amplifier, comprising:
        a positive input end, for receiving the reference voltage;
        an negative end; and
        an output end, coupled to the negative end of the amplifier;
    a resistor, coupled between the negative end of the amplifier and a ground end; and
    a first transistor, comprising:
        a first end, coupled to a bias voltage source;
        a control end, coupled to the output end of the amplifier; and
        a second end, the first transistor generating a reference current according to the reference voltage;
a clock signal generating module, for outputting the clock signal with the corresponding frequency according to the reference current; and
a main band-gap voltage reference circuit coupled to the positive input end of the amplifier, for providing the reference voltage, the main band-gap voltage reference circuit comprising:
    a temperature-rise-dependent current generating circuit, for generating a temperature-rise-dependent current which increases as the temperature rises, wherein the temperature-rise-dependent current generating circuit comprises:
        a temperature-rise-dependent band-gap voltage reference circuit, for generating a temperature-rise-dependent reference voltage which increases as the temperature rises;
        an amplifier, comprising:
            a positive input end coupled to the temperature-rise-dependent band-gap voltage reference circuit, for receiving the temperature-rise-dependent reference voltage;
            a negative end; and
            an output end;
        a first transistor, comprising:
            a first end, coupled to the bias voltage source;
            a second end, coupled to the negative input end of the amplifier; and
            a control end, coupled to the output end of the amplifier;
        a resistor, coupled between the ground end and the negative input end of the amplifier;
        a plurality of second transistors, each second transistor comprising:
            a first end, coupled to the bias voltage source;
            a second end; and
            a control end, coupled to the output end of the amplifier; and
        a switch, comprising:
            a plurality of input ends, each input end coupled respectively to the second end of a corresponding second transistor of the plurality of second transistors;
            an output end, for outputting the temperature-rise-dependent current; and
            a control end, for receiving a control signal for coupling one of the plurality of input ends of the switch to the output end of the switch; and
    a resistor coupled to an output end of the temperature-rise-dependent current generating circuit, for receiving the temperature-rise-dependent current;
    wherein the reference voltage outputted by the main band-gap voltage reference circuit is generated according to the resistor and the temperature-rise-dependent current.

12. The VCO of claim 11, wherein the reference voltage outputted by the main band-gap voltage reference circuit is directly proportional to temperature.

13. The VCO of claim 12, wherein relation between the temperature and the reference voltage outputted by the main band-gap voltage reference circuit is represented by a following formula:

$$V2=V1\times(1+JT);$$

wherein V2 represents the reference voltage outputted by the main band-gap voltage reference circuit, V1 represents a default reference voltage of the main band-gap voltage reference circuit, T represents temperature variation level, and J represents a temperature variable in a positive value.

14. The VCO of claim 11, wherein the reference voltage outputted by the main band-gap voltage reference circuit is inversely proportional to the temperature.

15. The VCO of claim 14, wherein relation between the temperature and the reference voltage outputted by the main band-gap voltage reference circuit is represented by a following formula:

$$V2=V1\times(1-JT);$$

wherein V2 represents the reference voltage outputted by the main band-gap voltage reference circuit, V1 represents a default reference voltage of the main band-gap voltage reference circuit, T represents temperature variation level, and J represents a temperature variable in a negative value.

16. The VCO of claim 11, wherein aspect ratios of the plurality of second transistors can be different individually.

17. The VCO of claim 11, wherein the first transistor and the plurality of second transistors are PMOS transistors.

18. The VCO of claim 11, wherein the switch can be realized with a fuse set.

19. The VCO of claim 18, wherein the fuse set comprises:

a plurality of fuses, each fuse coupled respectively between the second end of a corresponding second transistor of the plurality of second transistors and the temperature-rise-dependent current generating circuit;

wherein the plurality of fuses can be burnt down selectively according to the control signal.

20. The VCO of claim 11, further comprising a temperature-drop-dependent current generating circuit coupled to the resistor, for generating a temperature-drop-dependent current which decreases as the temperature rises.

21. The VCO of claim 4, wherein N is an odd number.

* * * * *